(12) United States Patent
Kim et al.

(10) Patent No.: US 7,508,873 B2
(45) Date of Patent: Mar. 24, 2009

(54) DIGITAL AMPLIFIER, PULSE WIDTH MODULATOR THEREOF AND METHOD FOR REDUCING POP NOISE FOR THE SAME

(75) Inventors: Tae Ho Kim, Seongnam-si (KR); Jong Hoon Oh, Seoul (KR)

(73) Assignee: Pulsus Technologies, Seoul (KR)

( * ) Notice: Subject to any disclaimer, the term of this patent is extended or adjusted under 35 U.S.C. 154(b) by 641 days.

(21) Appl. No.: 11/192,293

(22) Filed: Jul. 28, 2005

(65) Prior Publication Data

US 2006/0262843 A1 Nov. 23, 2006

(30) Foreign Application Priority Data

May 17, 2005 (KR) ...................... 10-2005-0041101

(51) Int. Cl.
*H03K 7/08* (2006.01)
*H03K 9/08* (2006.01)

(52) U.S. Cl. ......................... 375/238; 327/31; 327/172; 327/173; 327/174; 329/312; 370/205; 370/212

(58) Field of Classification Search ........................ None
See application file for complete search history.

(56) References Cited

U.S. PATENT DOCUMENTS

| | | | | |
|---|---|---|---|---|
| 5,262,733 A | * | 11/1993 | Nakajima et al. | 330/10 |
| 5,408,150 A | * | 4/1995 | Wilcox | 327/108 |
| 5,431,625 A | * | 7/1995 | Fabian et al. | 604/20 |
| 6,016,075 A | * | 1/2000 | Hamo | 330/10 |
| 6,487,246 B1 | * | 11/2002 | Hoeld | 375/238 |
| 2004/0217808 A1 | * | 11/2004 | Kim et al. | 330/10 |

FOREIGN PATENT DOCUMENTS

KR  1020040098925 A  11/2004

* cited by examiner

*Primary Examiner*—Shuwang Liu
*Assistant Examiner*—Gina McKie
(74) *Attorney, Agent, or Firm*—Volpe and Koenig, P.C.

(57) ABSTRACT

A pulse width modulator for use in a digital amplifier, includes a pop noise reducer for reducing pop noise by controlling a width and a phase of a pulse of a PWM signal output from the pulse width modulator, wherein the pop noise reducer contains: a PWM pulse register for storing a width and a phase values of a pulse of the PWM signal; and a pulse generator for outputting the PWM signal according to the values stored in the PWM pulse register. The pulse width modulator reduces pop noise generated when power supply to a digital amplifier is started and interrupted.

15 Claims, 6 Drawing Sheets

DIGITAL AMPLIFIER, PULSE WIDTH MODULATOR THEREOF AND METHOD FOR REDUCING POP NOISE FOR THE SAME

FIELD OF THE INVENTION

The present invention relates to a method for eliminating noise from an audio electronic appliance, and more particularly to a method and system for reducing pop noise in a speaker connected to a digital amplifier.

BACKGROUND OF THE INVENTION

FIG. 1 is a block diagram of a conventional digital amplifier and FIG. 2 is a graph showing a waveform output from a typical Pulse Width Modulation (PWM) modulator.

A digital amplifier, which is a device for amplifying an audio signal in a digital manner, includes a PWM modulator 100 and a PWM amplifier 200 for amplifying a PWM signal. In the digital amplifier, an audio signal is converted to a PWM signal which is a kind of digital signal by the PWM modulator 100 and the PWM signal is amplified by the PWM amplifier 200. Then, the amplified signal passes through a low pass filter 300, so that the amplified signal is converted back to the original analog signal.

In a general class-D amplifier, Pulse Code Modulation (PCM) audio signals sampled in a digital manner are input to the PWM modulator 100. Then, the PWM signal modulated by the PWM modulator 100 is amplified in the PWM amplifier 200, passes through the low pass filter 300, and is then input to a speaker 400 in a form of an analog signal.

The reason why the digital PCM signal is converted to the PWM signal is that the PWM signal has a constant magnitude (or height) and stores information on the original signal into the sample width thereof as shown in FIG. 2, whereas the PCM signal is sampled at a predetermined time interval and each sample contains information on the original signal in the sample size thereof. Because the PWM signal has a constant height (magnitude), it can define two states of 0/1 or ON/OFF and can more easily perform amplification and achieve high output by using an FET switching. The reason why amplifying the PWM signal is that the signal itself from the PWM modulator 100 has too small an output power which is insufficient to directly operate the speaker.

The PWM amplifier 200 generally includes a gate driver and a switching element. As the switching element, Metal Oxide Semiconductor Field Effect Transistors (MOSFETs) suitable for high-speed switching of big electric currents are usually used, which include 'N channel type' transistors and 'P channel type' transistors.

Further, the PWM amplifier 200 may be classified into a 'half bridge type' amplifier and a 'full bridge type' amplifier according to the circuit types. In the 'half bridge type' amplifier, two Field Effect Transistors (FETS) are vertically stacked and the connection point between the upper FET and the lower FET is connected to the speaker 400 through the low pass filter 300. The 'full bridge type' amplifier employs a circuit including a load connected between two half bridge output ports.

Therefore, the PWM amplifier 200 can be classified into an 'NN half bridge type' amplifier and an 'NN full bridge type' amplifier using only N channel MOSFETs, and a 'PN half bridge type' amplifier and a 'PN full bridge type' amplifier using both a P channel MOSFET and an N channel MOSFET.

When the amplified PWM signal is suddenly applied to the speaker, it generates pop noise. The pop noise refers to noise generated due to abrupt voltage change when an audio appliance is powered on or off and may cause a user to feel unpleasant. As shown in FIG. 2, because the PWM signal employs the pulse width modulation, abrupt voltage increase is inevitable when the PWM signal is initially applied. Such abrupt voltage increase causes abrupt introduction of electric current to the speaker 400. Therefore, in the class-D amplifier using the PWM modulator 100, it is an important technical subject to reduce the pop noise occurring when the power is applied.

In order to eliminate such pop noise, there has been a method in which a PWM signal is supplied before operation power is supplied to a transistor of the PWM amplifier and the PWM signal is continuously supplied for a predetermined period of time even after the power supply to the transistor of the PWM amplifier is stopped. Korean Patent Laid Open Publication No. 2004-0098925 discloses such a conventional method in detail.

According to another conventional method for eliminating pop noise, a switch such as a relay may be used. In this method, the relay is a mechanical switch which allows the PWM signal to be transferred to the speaker only after passage of some time from the time point when the PWM signal is applied. However, the relay inevitably increases the price of the product equipped with the relay. Therefore, it is impossible for a low-priced audio amplifier to employ the relay.

SUMMARY OF THE INVENTION

Accordingly, the present invention has been made to solve the above-mentioned problems occurring in the prior art, and an object of the present invention is to provide a solution for reducing pop noise generated when power supply to a digital amplifier is started and interrupted.

In accordance with an aspect of the present invention, there is provided a pulse width modulator for use in a digital amplifier, comprising: a pop noise reducer for reducing pop noise by controlling a width and a phase of a pulse of a PWM signal output from the pulse width modulator, wherein the pop noise reducer includes: a PWM pulse register for storing a width and a phase values of a pulse of the PWM signal; and a pulse generator for outputting the PWM signal according to the values stored in the PWM pulse register.

In accordance with another aspect of the present invention, there is provided a method for reducing pop noise in a digital amplifier using a pulse width modulator, the method comprising the steps of: (a) supplying electric power in order to drive the digital amplifier; (b) outputting a PWM signal having a controlled pulse width and controlled pulse phase during a predetermined time interval by the pulse width modulator after beginning of the supply of the electric power; and (c) outputting a normal PWM signal by the pulse width modulator after the controlled PWM signal is output, wherein the step (b) is performed by setting a width and a phase values of each PWM pulse register of the pulse width modulator.

In accordance with still another aspect of the present invention, there is provided a digital amplifier employing a pulse width modulation scheme, the digital amplifier comprising: a PWM modulator for pulse width modulating an audio signal; a pop noise reducer connected to the PWM modulator for controlling a pulse width and a phase of a PWM signal; a PWM amplifier for amplifying the PWM signal and outputting the amplified PWM signal; a low pass filter for filtering the amplified PWM signal and outputting an analog signal; and a speaker for reproducing the analog signal, wherein the pop noise reducer includes: a PWM pulse register for storing a width and a phase values of a pulse of the PWM signal; and a pulse generator for outputting the PWM signal according to the values stored in the PWM pulse register.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
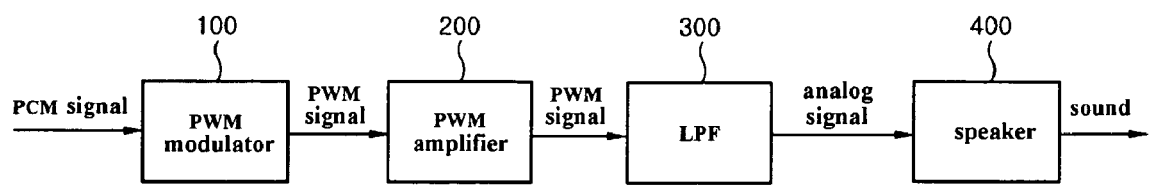
FIG. 1 is a block diagram of a conventional digital amplifier.
Figure 2:
FIG. 2 is a graph illustrating an output waveform of a typical PWM modulator.

Hereinafter, a preferred embodiment of the present invention will be described with reference to the accompanying drawings. In the following description and drawings, the same reference numerals are used to designate the same or similar components, and so repetition of the description on the same or similar components will be omitted.

Hereinafter, a digital amplifier capable of reducing pop noise in accordance with the present invention will be described in detail with reference to FIGS. 3 through 8B.

Figure 3:
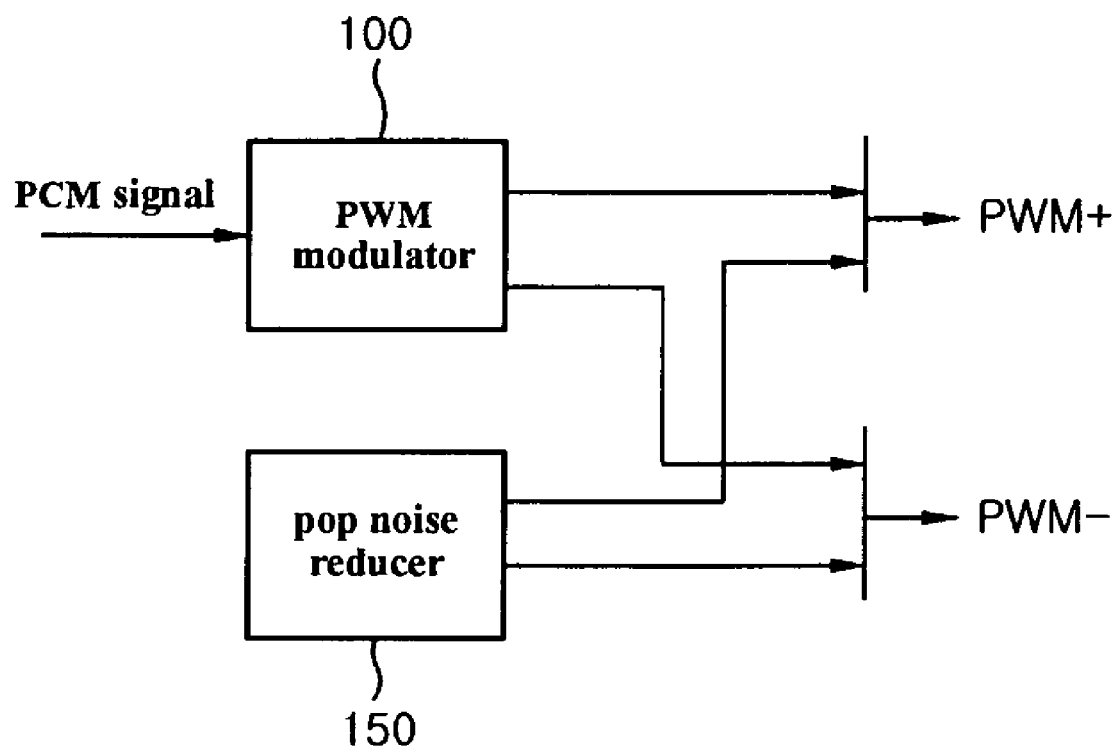
FIG. 3 is a block diagram of a PWM modulator and a pop noise reducer in accordance with the present invention.

FIG. 3 is a block diagram of a PWM modulator 100 and a pop noise reducer 150 in accordance with the present invention. The pop noise reducer 150 in combination with the PWM modulator 100 can generate a PWM signal having a waveform which a designer of the PWM modulator 100 wants to obtain. Although the pop noise reducer 150 and the PWM modulator 100 are shown in separate blocks in the drawing in order to facilitate the description, it goes without saying that pop noise reducer 150 may be incorporated into the PWM modulator 100 as a part of the modulator 100.

Figure 4:
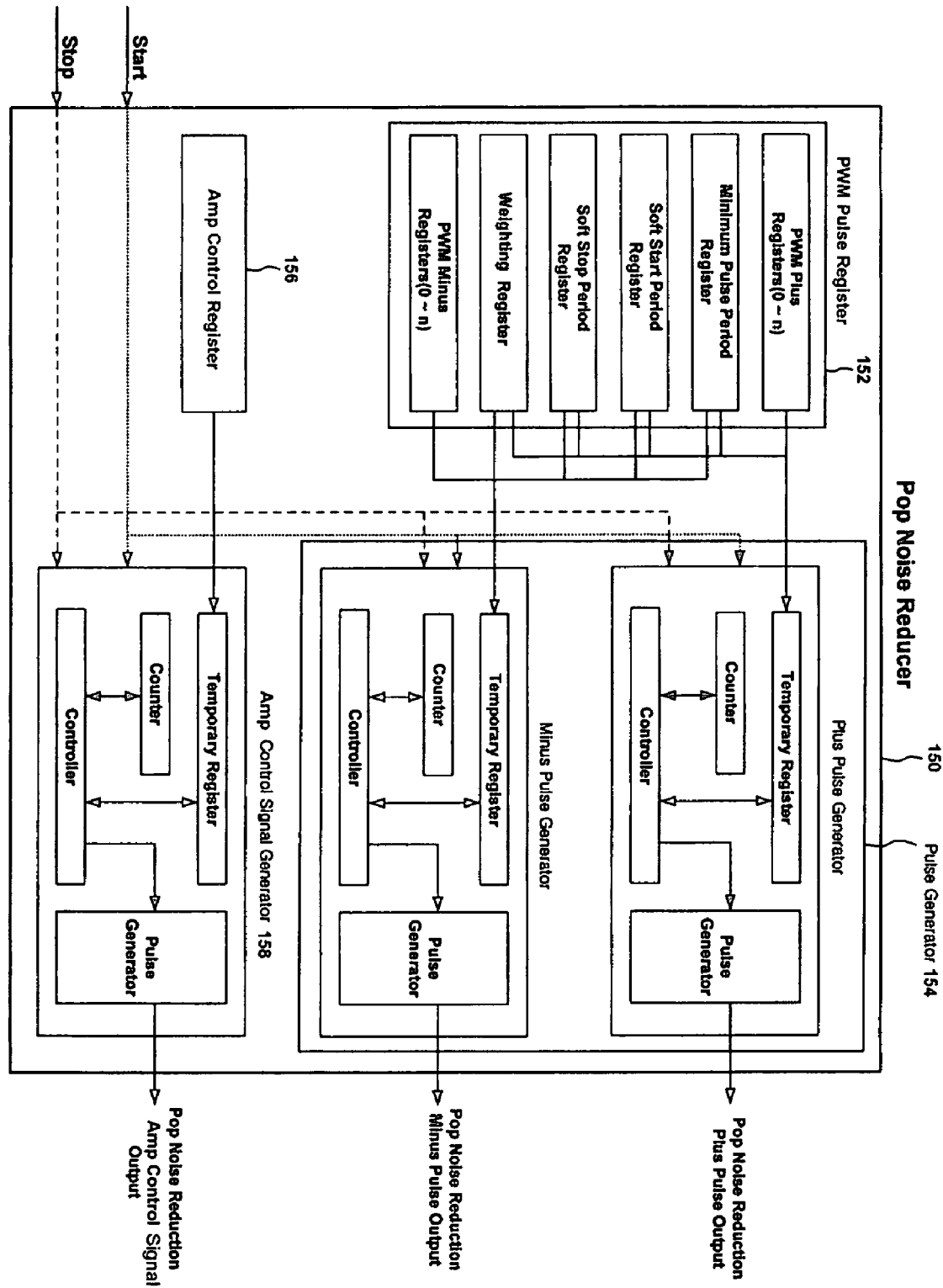
FIG. 4 is a block diagram of the pop noise reducer in accordance with the present invention.

FIG. 4 is a block diagram illustrating an example of the structure of the pop noise reducer 150. The pop noise reducer 150 includes a PWM pulse register 152, a pulse generator 154, an amp control register 156 and an amp control signal generator 158. By using the PWM pulse register 152 and the pulse generator 154, the pop noise reducer 150 can control a width and a phase of each pulse of a PWM plus signal and a PWM minus signal. Further, the pop noise reducer 150 can also control the PWM amplifier 200 to start or to stop by using the amp control register 156 and the amp control signal generator 158.

In detail, the PWM pulse register 152 includes PWM plus registers 0 to n, PWM minus registers 0 to n, a minimum pulse period register, a soft start period register, a soft stop period register and a weighting register, which will be described later. The pulse generator 154 includes a plus pulse generator and a minus pulse generator and each of the plus and minus pulse generators has a temporary register, a counter, a controller and a pulse generator, which will be also described later.

Each of PWM plus registers 0 to n stores a width and a phase values of a pulse corresponding to each interval of the PWM plus signal. That is, a PWM plus register m (wherein m is an integer larger than or equal to 0 and smaller than or equal to n) stores a width and a phase values of a pulse in the (m+1)th interval of the PWM plus signal.

First, a width and a phase values in the PWM plus register 0 are stored in the temporary register of the plus pulse generator. The pulse generator of the plus pulse generator outputs the first interval of the PWM plus signal corresponding to the phase value of the temporary register. The controller compares a counting value of the counter with the pulse width value of the temporary register. If the two values are not identical, the counter simply adds a predetermined increment to the counting value without any other operation. However, if the two values are identical, the counting value is reset to 0; a width and a phase values in the PWM plus register 1 are stored in the temporary register; and the second interval of the PWM plus signal corresponding to the phase value of the temporary register is output. Thereafter, the same operation as described above is repeated until output of the (n+1)-th interval of the PWM plus signal is completed.

In the same manner as for the PWM plus signal, the PWM minus signal is output according to the values set in the PWM minus registers 0 to n.

In this way, a designer can produce a PWM modulator which can generate a controlled PWM signal by setting a width and a phase values of each of the PWM pulse registers in the pop noise reducer 150. The specific construction of the pop noise reducer 150 may be modified in various ways by those skilled in the art.

An output port of the PWM modulator 100 may be connected to a PWM amplifier 200 of various types including an 'NN half bridge type' and an 'NN full bridge type' using only N channel MOSFETs, and a 'PN half bridge type' and a 'PN full bridge type' using both a P channel MOSFET and an N channel MOSFET. According to the type of the PWM amplifier 200, the PWM signal causing a minimal pop noise may have various waveforms. Therefore, it is necessary for the designer of the PWM modulator to find an optimum waveform capable of reducing the pop noise by controlling the output waveform from the PWM modulator 100.

In order to reduce the pop noise produced in a digital amplifier, it is necessary to apply a PWM signal controlled during a predetermined time interval from the time point when power begins to be supplied or the power supply is interrupted. Especially, the control during a predetermined time interval form the time point when power begins to be supplied is more important. After the predetermined time elapses, a normal PWM signal is output.

Figure 5A:
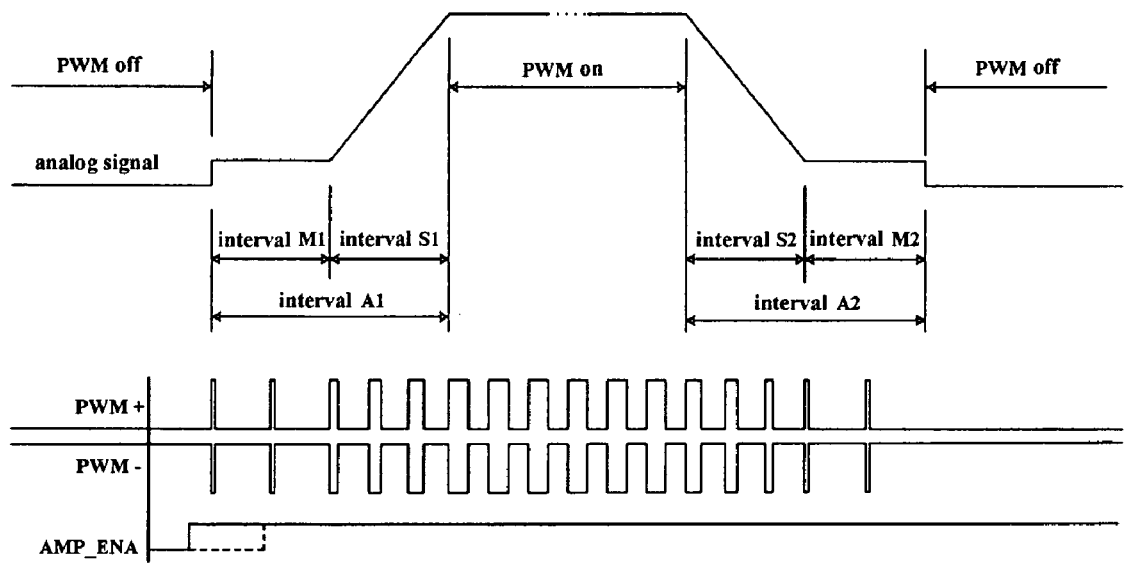
FIGS. 5A to 5C are graphs illustrating an output waveform of the PWM modulator for reducing pop noise when an output port of the PWM modulator is connected to a PWM amplifier of a 'PN half bridge type' or a 'PN full bridge type' using both a P channel MOSFET and an N channel MOSFET.
Figure 5B:
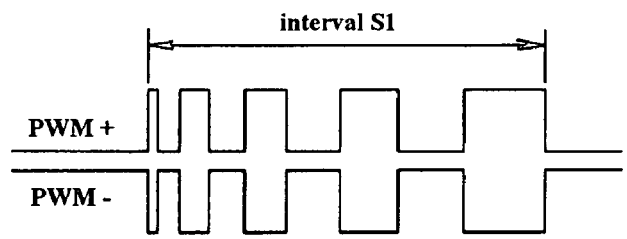
Figure 5C:
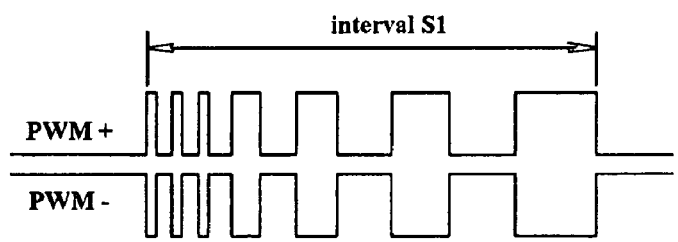

FIGS. 5A to 5C are graphs illustrating an output waveform of the PWM modulator 100 for reducing pop noise in case that the output port of the PWM modulator 100 is connected to the PWM amplifier 200 of the 'PN half bridge type' or the 'PN full bridge type' using both the P channel MOSFET and the N channel MOSFET. In this case, it is preferable to use the minimum pulse period register, the soft start period register, the soft stop period register and the weighting register in lieu of the PWM plus registers 0 to n and the PWM minus registers o to n.

In order to output the waveform as shown in FIG. 5A, the pop noise reducer 150 gradually increases the pulse width of the PWM signal when the power for the digital amplifier is supplied and gradually decreases the pulse width of the PWM signal when the power supply to the digital amplifier is interrupted. At this time, the PWM plus waveform and the PWM minus waveform are symmetric structures wherein they have opposite phases and the same width. When the waveform as shown in FIG. 5A has been applied, a remarkable reduction of pop noise was confirmed from a frequency analysis.

Referring to FIGS. 4 to 5C, the pop noise reducer 150 generates a pulse having a minimum width during a time interval M1 from the start of the power supply for the digital amplifier, and then gradually widens the pulse width during a time interval S1. The time intervals M1 and S1 are controllable values and are set in the minimum pulse period register and the soft start period register, respectively. A time interval A1, which is the sum of the time interval M1 and the time interval S1, is a duration during which the pop noise reducer 150 performs the initial control. The 'PWM on' interval is a time interval during which a normal PWM signal is output. In order to widen the pulse width during the time interval S1, there are two methods as follows: one is to widen the pulse width linearly as shown in FIG. 5B and the other is to widen the pulse width exponentially as shown in FIG. 5C. By setting the weighting register of the PWM pulse register 152, the method of widening the pulse width during the time interval S1 can be determined.

In contrast, when the power supply is interrupted, the pop noise reducer 150 gradually decreases the pulse width during a time interval S2, and then generates a pulse having a minimum width during a time interval M2, and then stops the output of the PWM signal. The time intervals M2 and S2 are controllable values and are set in the minimum pulse period register and the soft stop period register, respectively. A time interval A2, which is the sum of the time interval M2 and the time interval S2, is a duration during which the pop noise reducer 150 performs the final control. In order to decrease the pulse width during the time interval S2, there are two methods as follows: one is to decrease the pulse width linearly and the other is to decrease the pulse width exponentially. The method of decreasing the pulse width during the time interval S2 is determined by setting the weighting register.

Figure 6:
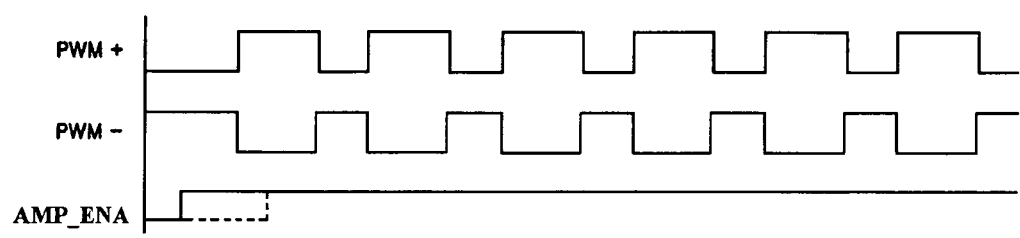
FIG. 6 is a graph showing an exemplary output waveform of the PWM modulator for reducing pop noise when the output port of the PWM modulator is connected to the PWM amplifier of an 'NN full bridge type' using only N channel MOSFETs.

FIG. 6 is a graph showing an exemplary output waveform of the PWM modulator 100 for reducing pop noise when the output port of the PWM modulator 100 is connected to the PWM amplifier 200 of the 'NN full bridge type' using only the N channel MOSFETs. As shown in FIG. 6, the phase of the PWM plus signal is opposite to the phase of the PWM minus signal and both signals have a constant pulse width. That is, the PWM plus signal and the PWM minus signal have a symmetrical waveform. When the waveform as shown in FIG. 6 has been applied, a remarkable reduction of pop noise was confirmed from a frequency analysis.

Figure 7:
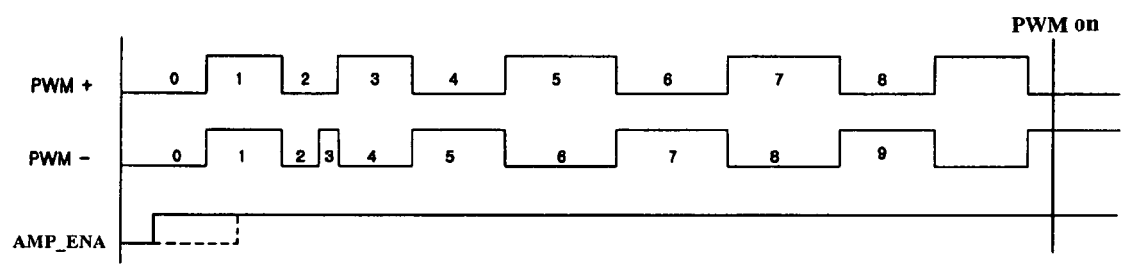
FIG. 7 is a graph showing an exemplary output waveform of the PWM modulator for reducing pop noise when the output port of the PWM modulator is connected to the PWM amplifier of an 'NN half bridge type' using only N channel MOSFETs.

FIG. 7 is a graph illustrating an exemplary output waveform of the PWM modulator 100 for reducing pop noise when the output port of the PWM modulator 100 is connected to the PWM amplifier 200 of the 'NN half bridge type' using only the N channel MOSFETS. Table 1 shows a pulse width and a phase values stored in the PWM plus registers 0 to n and the PWM minus registers 0 to n of the PWM pulse register 152, which generates the waveform shown in FIG. 7.

TABLE 1

| Register name | Width (ns) | Phase | Register name | Width (ns) | Phase |
|---|---|---|---|---|---|
| PWM plus register 0 | 640 | 0 | PWM minus register 0 | 640 | 0 |
| PWM plus register 1 | 1320 | 1 | PWM minus register 1 | 1320 | 1 |
| PWM plus register 2 | 975 | 0 | PWM minus register 2 | 655 | 0 |
| PWM plus register 3 | 920 | 1 | PWM minus register 3 | 320 | 1 |
| PWM plus register 4 | 1155 | 0 | PWM minus register 4 | 920 | 0 |
| PWM plus register 5 | 1245 | 1 | PWM minus register 5 | 1155 | 1 |
| PWM plus register 6 | 1160 | 0 | PWM minus register 6 | 1245 | 0 |
| PWM plus register 7 | 1065 | 1 | PWM minus register 7 | 1160 | 1 |
| PWM plus register 8 | 1090 | 0 | PWM minus register 8 | 1065 | 0 |
| PWM plus register 9 | | | PWM minus register 9 | 1090 | 1 |

When the PWM pulse register 152 is set with the values shown in Table 1, the waveform as shown in FIG. 7 can be obtained. In order to output the waveform as shown in FIG. 7, the pop noise reducer 150 controls the PWM plus signal and the PWM minus signal to maintain the same phase when power is applied to the digital amplifier. After passage of a predetermined time interval, the pop noise reducer 150 changes their phases to be opposite to each other and changes the pulse width to be gradually increased.

In detail, when power is applied to the digital amplifier, i.e., in interval 0, the PWM plus signal and the PWM minus signal are made to have the same phase, i.e., LOW phase, and then, after a predetermined time is passed, i.e., in interval 1, both signals are changed to have HIGH phase. Thereafter, after a predetermined time is passed, i.e., in interval 2, both signals are changed to have LOW phase. Then, for example, in interval 3 of the PWM minus signal, only the PWM minus signal is changed to have HIGH phase so that the phase of the PWM plus signal is opposite to the phase of the PWM minus signal. Referring to FIG. 7, interval 3 of the PWM minus waveform has a phase opposite to the phase of interval 2 of the PWM plus waveform. Thereafter, the both signals maintain their phases to be opposite each other and the pulse width of both signals are gradually increased.

Figure 8A:
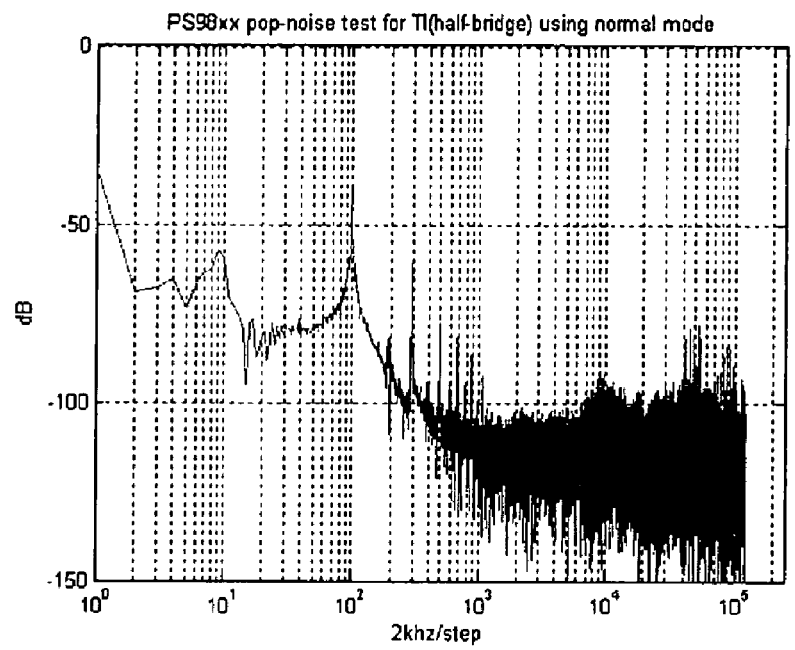
FIG. 8A is a graph showing pop noise measured when a typical PWM signal is applied to the digital amplifier.
Figure 8B:
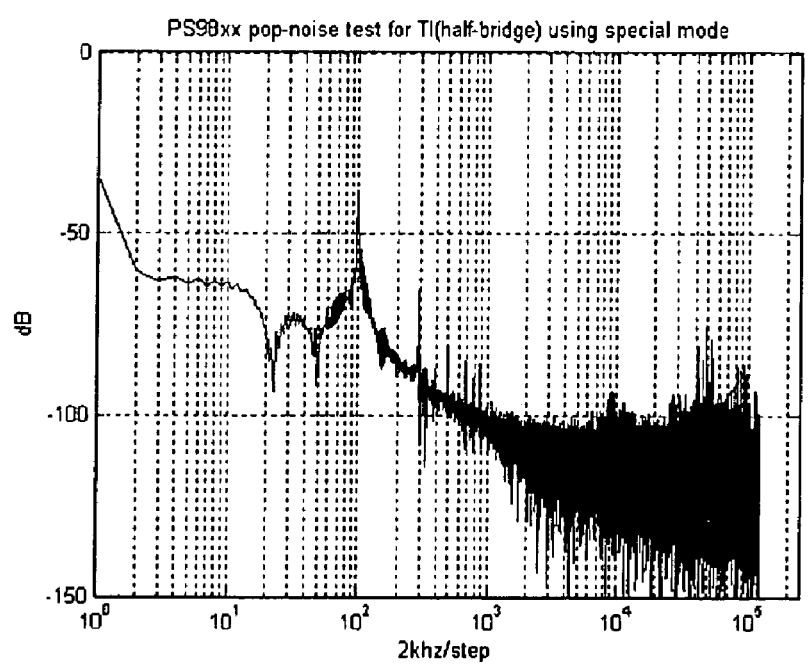
FIG. 8B is a graph showing pop noise measured when the PWM signal shown in FIG. 7 is applied to the digital amplifier.

FIG. 8A is a graph showing pop noise measured when a typical PWM signal is applied to the digital amplifier and FIG. 8B is a graph showing pop noise measured when the PWM signal shown in FIG. 7 is applied to the digital amplifier. When a typical PWM signal is applied, irregular frequencies from 2 to 20 KHz are observed. However, when the PWM signal shown in FIG. 7 is applied, frequencies having a smooth variance as shown in FIG. 8B are observed. Therefore, it is noted that the PWM initial sequence as shown in FIG. 7 is very effective when the PWM modulator 100 has an output port of an 'NN half bridge type'.

A designer of the PWM modulator 100 can produce the waveform as shown in FIG. 7 by setting values of the PWM pulse registers of the pop noise reducer 150. However, the shown waveform is only an example, and the designer of the PWM modulator must select proper values according to various output ports connected to the PWM modulator 100.

A process of trial and error is necessary in order to find a PWM signal causing a minimal pop noise for various output ports. Therefore, it is possible to find a PWM signal causing a minimal pop noise by repeating a process of applying a certain PWM signal and then analyzing the pop noise. In order to analyze the pop noise, a method of analyzing the frequency of the output signal from a digital amplifier is usually used. As a result of the analysis of the frequency, when the pop noise has been remarkably reduced, the applied PWM signal is selected as a PWM initial sequence of the corresponding output port.

Further, it is preferable to control the start and the stop of the PWM amplifier 200 as well as the waveform of the PWM signal in order to reduce pop noise. The amp control signal generator 158 of the pop noise reducer 150 generates an AMP_ENA signal according to values stored in the amp control register 156. The amp control signal generator 158 supplies the PWM amplifier 200 with the AMP_ENA signal in order to start or stop the PWM amplifier 200. For example, if the AMP_ENA signal is changed from LOW values to HIGH values, the PWM amplifier 200 may be enabled and if the AMP_ENA signal is changed from HIGH values to LOW values, the PWM amplifier 200 may be disabled. By using the AMP_ENA signal, it is possible to control the start timing or stop timing of the PWM amplifier 200.

One example of the AMP_ENA signal is illustrated in FIG. 7. Referring to FIG. 7, the AMP_ENA signal instructing the start of the PWM amplifier 200 is applied to the PWM amplifier 200 when both the PWM plus signal and the PWM minus signal have the LOW phase initially, i.e., in interval 0.

A process of trial and error is also necessary in order to find an AMP_ENA signal causing a minimal pop noise for various output ports. Therefore, it is possible to find an AMP_ENA signal causing a minimal pop noise by repeating a process of applying a certain AMP_ENA signal and then analyzing the pop noise.

According to the present invention, a PWM signal and an AMP_ENA signal having a predetermined waveform are applied to the digital amplifier when power supply to the digital amplifier is started and interrupted, so that the pop noise generated in the digital amplifier can be reduced.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A pulse width modulator for use in a digital amplifier, comprising:
a pop noise reducer for reducing pop noise by controlling a width and a phase of a pulse of a pulse width modulation (PWM) signal output from the pulse width modulator, wherein the pop noise reducer includes:
a PWM pulse register for storing a width and a phase values of a pulse of the PWM signal; and
a pulse generator for outputting the PWM signal according to the values stored in the PWM pulse register
wherein a PWM amplifier of one of a PN half bridge type and a PN full bridge type using both a P channel MOSFET and an N channel MOSFET is connected to an output port of the pulse width modulator and the pop noise reducer gradually increases the pulse width of the PWM signal over at least two pulses when power is applied to the digital amplifier.

2. The pulse width modulator as claimed in claim 1, wherein the pop noise reducer generates a pulse having a minimum width during a time interval M1 from a beginning of power supply to the digital amplifier and gradually widens the pulse width during a time interval S1, the time intervals S1 and M1 being controllable values.

3. The pulse width modulator as claimed in claim 2, wherein the pop noise reducer gradually increases the pulse width of the PWM signal exponentially during the time interval S1.

4. A pulse width modulator for use in a digital amplifier, comprising:
a pop noise reducer for reducing pop noise by controlling a width and a phase of a pulse of a pulse width modulation (PWM) signal output from the pulse width modulator, wherein the pop noise reducer includes:
a PWM pulse register for storing a width and a phase values of a pulse of the PWM signal; and
a pulse generator for outputting the PWM signal according to the values stored in the PWM pulse register,
wherein a PWM amplifier of an NN half bridge type using only N channel MOSFETs is connected to an output port of the pulse width modulator, the pop noise reducer controls a PWM plus signal and a PWM minus signal to maintain the same phase when power is applied to the digital amplifier, and, after passage of a predetermined time interval, the pop noise reducer changes their phases to be opposite to each other during a predetermined time, and then, gradually increases the pulse width thereof while maintaining their phases to be opposite to each other.

5. A pulse width modulator for use in a digital amplifier, comprising:
a pop noise reducer for reducing pop noise by controlling a width and a phase of a pulse of a pulse width modulation (PWM) signal output from the pulse width modulator,
wherein the pop noise reducer includes:
a PWM pulse register for storing a width and a phase values of a pulse of the PWM signal; and
a pulse generator for outputting the PWM signal according to the values stored in the PWM pulse register,
wherein a PWM amplifier of an NN full bridge type using only N channel MOSFETs is connected to an output port of the pulse width modulator, and the pop noise reducer controls a PWM plus signal and a PWM minus signal to maintain the same phase when power is applied to the digital amplifier, and, after passage of a predetermined time interval, the pop noise reducer changes their phases to be opposite to each other during a predetermined time, and then, controls a PWM plus signal and a PWM minus signal to have a constant pulse width.

6. A method for reducing pop noise in a digital amplifier using a pulse width modulator, the method comprising:
(a) supplying electric power in order to drive the digital amplifier;
(b) outputting a pulse width modulation (PWM) signal having a controlled pulse width and controlled pulse phase during a predetermined time interval by the pulse width modulator after beginning of the supply of the electric power; and
(c) outputting a normal PWM signal by the pulse width modulator after the controlled PWM signal is output,
wherein step (b) is performed by setting a width and a phase values of outputted from a PWM pulse resister of the pulse width modulator, and
in step (b), the pulse width of the PWM signal is gradually increased over at least two pulses when an output port of the pulse width modulator is connected to a PWM amplifier of a PN half bridge type or a PN full bridge type using both a P channel MOSFET and an N channel MOSFET.

7. A method for reducing pop noise in a digital amplifier using a pulse width modulator, the method comprising:
   (a) supplying electric power in order to drive the digital amplifier;
   (b) outputting a pulse width modulation (PWM) signal having a controlled pulse width and controlled pulse phase during a predetermined time interval by the pulse width modulator after beginning of the supply of the electric power;
   (c) outputting a normal PWM signal by the pulse width modulator after the controlled PWM signal is output,
   (d) interrupting electric power supply in order to stop operation of the digital amplifier;
   (e) outputting a PWM signal having a controlled pulse width and controlled pulse phase by the pulse width modulator during a predetermined time interval after interruption of the electric power supply; and
   (f) stopping output of the PWM signal by the pulse width modulator after the controlled PWM signal is output
   wherein step (b) is performed by setting a width and a phase values outputted from a PWM pulse resister of the pulse width modulator, and
   in step (e), the pulse width of the PWM signal is gradually decreased over at least two pulses when an output port of the pulse width modulator is connected to a PWM amplifier of a PN half bridge type or a PN full bridge type using both a P channel MOSFET and an N channel MOSFET.

8. The method as claimed in claim 6, wherein step (b) includes:
   (b1) generating a pulse having a minimum pulse width during a time interval M1 after beginning of power supply to the digital amplifier; and
   (b2) gradually increasing a pulse width during a time interval S1, the time intervals S1 and M1 being controllable values.

9. The method as claimed in claim 7, wherein step (e) includes:
   (e1) gradually decreasing a pulse width during a time interval S2 after interruption of power supply to the digital amplifier; and
   (e2) generating a pulse having a minimum pulse width during a time interval M2, the time intervals S2 and M2 being controllable values.

10. A method for reducing pop noise in a digital amplifier using a pulse width modulator, the method comprising:
   (a) supplying electric power in order to drive the digital amplifier;
   (b) outputting a pulse width modulation (PWM) signal having a controlled pulse width and controlled pulse phase during a predetermined time interval by the pulse width modulator after beginning of the supply of the electric power; and
   (c) outputting a normal PWM signal by the pulse width modulator after the controlled PWM signal is output,
   wherein step (b) is performed by setting a width and a phase values outputted from a PWM pulse resister of the pulse width modulator
   wherein, in step (b), when an output port of the pulse width modulator is connected to a PWM amplifier of an NN half bridge type using only N channel MOSFETs, a PWM plus signal and a PWM minus signal are initially controlled to maintain the same phase during a predetermined time interval and are then controlled to change their phases opposite to each other during a predetermined time interval and are then controlled to increase the pulse width thereof while maintaining their phases to be opposite to each other.

11. A method for reducing pop noise in a digital amplifier using a pulse width modulator, the method comprising:
   (a) supplying electric power in order to drive the digital amplifier;
   (b) outputting a pulse width modulation (PWM) signal having a controlled pulse width and controlled pulse phase during a predetermined time interval by the pulse width modulator after beginning of the supply of the electric power; and
   (c) outputting a normal PWM signal by the pulse width modulator after the controlled PWM signal is output,
   wherein step (b) is performed by setting a width and a phase values outputted from a PWM pulse resister of the pulse width modulator,
   wherein, in step (b), when an output port of the pulse width modulator is connected to a PWM amplifier of an NN full bridge type using only N channel MOSFETs, a PWM plus signal and a PWM minus signal are controlled to maintain the same phase when power is applied to the digital amplifier, and, after passage of a predetermined time interval, the pop noise reducer changes their phases to be opposite to each other during a predetermined time, and then, controls the PWM plus signal and the PWM minus signal to have a constant pulse width.

12. A digital amplifier employing a pulse width modulation scheme, the digital amplifier comprising:
   a pulse width modulation (PWM) modulator for pulse width modulating an audio signal;
   a pop noise reducer connected to the PWM modulator for controlling a pulse width and a phase of a PWM signal;
   a PWM amplifier for amplifying the PWM signal and outputting the amplified PWM signal;
   a low pass filter for filtering the amplified PWM signal and outputting an analog signal; and
   a speaker for reproducing the analog signal,
   wherein the pop noise reducer includes:
   a PWM pulse register for storing a width and a phase values of a pulse of the PWM signal; and
   a pulse generator for outputting the PWM signal according to the values stored in the PWM pulse register
   wherein, if a PWM amplifier of a PN half bridge type or a PN full bridge type using both a P channel MOSFET and an N channel MOSFET is connected to an output port of the pulse width modulator, the pop noise reducer gradually increases the pulse width of the PWM signal over at least two pulses when power is applied to the digital amplifier.

13. The digital amplifier as claimed in claim 12, wherein the pop noise reducer further controls the start and the stop of the PWM amplifier by using an AMP_ENA signal which instructs the PWM amplifier to start or stop.

14. A digital amplifier employing a pulse width modulation scheme, the digital amplifier comprising:
   a pulse width modulation (PWM) modulator for pulse width modulating an audio signal;
   a pop noise reducer connected to the PWM modulator for controlling a pulse width and a phase of a PWM signal;
   a PWM amplifier for amplifying the PWM signal and outputting the amplified PWM signal;
   a low pass filter for filtering the amplified PWM signal and outputting an analog signal; and
   a speaker for reproducing the analog signal, wherein the pop noise reducer includes:

a PWM pulse register for storing a width and a phase values of a pulse of the PWM signal; and a pulse generator for outputting the PWM signal according to the values stored in the PWM pulse register, wherein a PWM amplifier of an NN half bridge type using only N channel MOSFETs is connected to an output port of the pulse width modulator, the pop noise reducer controls a PWM plus signal and a PWM minus signal to maintain the same phase when power is applied to the digital amplifier, and, after passage of a predetermined time interval, the pop noise reducer changes their phases to be opposite to each other during a predetermined time, and then, gradually increases the pulse width thereof while maintaining their phases to be opposite to each other.

15. A digital amplifier employing a pulse width modulation scheme, the digital amplifier comprising:

a pulse width modulation (PWM) modulator for pulse width modulating an audio signal;

a pop noise reducer connected to the PWM modulator for controlling a pulse width and a phase of a PWM signal;

a PWM amplifier for amplifying the PWM signal and outputting the amplified PWM signal;

a low pass filter for filtering the amplified PWM signal and outputting an analog signal; and a speaker for reproducing the analog signal, wherein the pop noise reducer includes:

a PWM pulse register for storing a width and a phase values of a pulse of the PWM signal; and a pulse generator for outputting the PWM signal according to the values stored in the PWM pulse register, wherein a PWM amplifier of an NN full bridge type using only N channel MOSFETs is connected to an output port of the pulse width modulator, the pop noise reducer controls a PWM plus signal and a PWM minus signal to maintain the same phase when power is applied to the digital amplifier, and, after passage of a predetermined time interval, the pop noise reducer changes their phases to be opposite to each other during a predetermined time, and then, controls the PWM plus signal and the PWM minus signal to have a constant pulse width.

* * * * *